United States Patent
Bilhan et al.

(10) Patent No.: US 12,212,317 B2
(45) Date of Patent: Jan. 28, 2025

(54) STRESS REDUCTION ON STACKED TRANSISTOR CIRCUITS

(71) Applicant: TEXAS INSTRUMENTS INCORPORATED, Dallas, TX (US)

(72) Inventors: Erkan Bilhan, Dallas, TX (US); Francisco A. Cano, Sugar Land, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/131,009

(22) Filed: Apr. 5, 2023

(65) Prior Publication Data

US 2023/0238959 A1 Jul. 27, 2023

Related U.S. Application Data

(62) Division of application No. 16/262,327, filed on Jan. 30, 2019, now Pat. No. 11,626,875.

(60) Provisional application No. 62/795,461, filed on Jan. 22, 2019, provisional application No. 62/786,507, filed on Dec. 30, 2018, provisional application No. 62/660,593, filed on Apr. 20, 2018.

(51) Int. Cl.
*H03K 19/003* (2006.01)
*H03K 19/20* (2006.01)

(52) U.S. Cl.
CPC ....... *H03K 19/00315* (2013.01); *H03K 19/20* (2013.01)

(58) Field of Classification Search
CPC ....... H03K 19/00315; H03K 19/00384; H03K 19/0944; H03K 19/20
See application file for complete search history.

(56) References Cited

U.S. PATENT DOCUMENTS

| | | | |
|---|---|---|---|
| 5,317,206 A | 5/1994 | Hanibuchi et al. | |
| 5,347,152 A * | 9/1994 | Sundaresan | H10B 10/12 365/182 |
| 5,381,051 A | 1/1995 | Morton | |
| 5,426,383 A | 6/1995 | Kumar | |
| 5,514,994 A * | 5/1996 | Sawada | H02M 3/07 327/390 |
| 5,550,486 A | 8/1996 | Sweeney | |
| 5,629,638 A | 5/1997 | Kumar | |
| 5,694,061 A * | 12/1997 | Morosawa | G09G 3/3677 326/88 |
| 5,726,589 A | 5/1998 | Cahill et al. | |
| 5,949,271 A * | 9/1999 | Fujikura | H03K 19/01735 326/88 |
| 5,952,851 A | 9/1999 | Yuen | |

(Continued)

*Primary Examiner* — Jason M Crawford
(74) *Attorney, Agent, or Firm* — Carl G. Peterson; Frank D. Cimino

(57) ABSTRACT

A circuit includes a first transistor having first and second current terminals and a first control input, and a second transistor having third and fourth current terminals and a second control input. The third current terminal is connected to the second current terminal at an intermediate node and the fourth current terminal connected to a ground or supply node. In some cases, a third transistor is connected to the intermediate node to bias the intermediate rather than letting the intermediate node float. In other cases, a capacitor is connected to the intermediate node to reduce a negative voltage that might otherwise be present on the intermediate node.

20 Claims, 5 Drawing Sheets

(56) References Cited

U.S. PATENT DOCUMENTS

| | | | | |
|---|---|---|---|---|
| 6,016,064 | A * | 1/2000 | Saeki | H03K 5/133 326/121 |
| 6,225,820 | B1 | 5/2001 | Kim et al. | |
| 6,239,958 | B1 | 5/2001 | Kato et al. | |
| 6,331,787 | B1 | 12/2001 | Whitworth et al. | |
| 6,522,323 | B1 * | 2/2003 | Sasaki | H03K 19/018585 326/62 |
| 6,600,354 | B2 | 7/2003 | Saeki | |
| 6,975,143 | B2 * | 12/2005 | Deng | H03K 19/0948 326/119 |
| 7,202,863 | B2 * | 4/2007 | Kimura | G09G 3/36 345/204 |
| 7,239,190 | B2 * | 7/2007 | Saeki | G06F 1/10 327/299 |
| 8,111,089 | B2 | 2/2012 | Cocchi et al. | |
| 8,456,402 | B2 * | 6/2013 | Kimura | G09G 3/36 345/204 |
| 8,674,979 | B2 * | 3/2014 | Hayakawa | G09G 3/3674 345/214 |
| 9,214,475 | B2 * | 12/2015 | Pappas | G11C 19/28 |
| 9,466,618 | B2 * | 10/2016 | Miyake | H01L 27/1225 |
| 9,553,583 | B2 * | 1/2017 | Yamazaki | G11C 19/28 |
| 9,742,378 | B2 * | 8/2017 | Tanada | H03K 3/01 |
| 10,050,524 | B1 * | 8/2018 | Rana | G06F 1/08 |
| 10,297,331 | B2 * | 5/2019 | Miyake | H01L 27/1255 |
| 11,626,875 | B2 * | 4/2023 | Bilhan | H03K 19/00315 326/9 |
| 11,831,309 | B2 * | 11/2023 | Bilhan | H03K 3/356113 |
| 2003/0020520 | A1 * | 1/2003 | Miyake | H01L 27/1214 257/E27.111 |
| 2008/0116952 | A1 | 5/2008 | Kase et al. | |
| 2011/0316505 | A1 * | 12/2011 | Shrivastava | H03K 19/00315 323/282 |
| 2012/0242370 | A1 * | 9/2012 | Park | H03K 3/012 326/112 |
| 2013/0214854 | A1 * | 8/2013 | Abe | H01L 29/7869 257/43 |
| 2014/0232432 | A1 | 8/2014 | Fish et al. | |
| 2016/0028398 | A1 * | 1/2016 | Wu | H03K 19/09441 326/120 |
| 2016/0232956 | A1 * | 8/2016 | Ishizu | G11C 8/12 |
| 2016/0233866 | A1 * | 8/2016 | Ishizu | H03K 19/0008 |
| 2019/0326909 | A1 * | 10/2019 | Bilhan | H03K 19/00315 |
| 2019/0326910 | A1 * | 10/2019 | Bilhan | H03K 3/356113 |
| 2021/0050778 | A1 * | 2/2021 | Rana | H02M 3/073 |
| 2023/0238959 | A1 * | 7/2023 | Bilhan | H03K 19/00315 326/9 |
| 2024/0088896 | A1 * | 3/2024 | Bilhan | H03K 3/356113 |

* cited by examiner

STRESS REDUCTION ON STACKED
TRANSISTOR CIRCUITS

CROSS-REFERENCE TO RELATED
APPLICATIONS

The present application is a continuation of U.S. patent application Ser. No. 16/262,327, filed Jan. 30, 2019 (scheduled to grant as U.S. Pat. No. 11,626,875), which claims the benefit of U.S. Provisional Patent Application No. 62/660,593, filed Apr. 20, 2018, U.S. Provisional Patent Application No. 62/786,507, filed Dec. 30, 2018, and U.S. Provisional Patent Application No. 62/795,461, filed Jan. 22, 2019, all of which are hereby incorporated herein by reference in their entirety.

BACKGROUND

Many types of circuits include two or more transistors connected in a stacked configuration. In the case of, for example, metal oxide semiconductor (MOS) transistors, the source of one transistor is connected to the drain of the next transistor in the stack. NAND gates, NOR gates, flip-flops often include stacked transistors.

SUMMARY

A circuit includes a first transistor having first and second current terminals and a first control input, and a second transistor having third and fourth current terminals and a third control input. The third current terminal is connected to the second current terminal at an intermediate node and the fourth current terminal connected to a ground node. In some cases, a third transistor is connected to the intermediate node to bias the intermediate rather than letting the intermediate node float. In other cases, a capacitor is connected to the intermediate node to reduce a negative voltage that might otherwise be present on the intermediate node.

BRIEF DESCRIPTION OF THE DRAWINGS

For a detailed description of various examples, reference will now be made to the accompanying drawings in which.

DETAILED DESCRIPTION

In a stacked transistor configuration, the node interconnecting two transistors may float during operation of the circuit containing the stacked transistors. Further, due to parasitic capacitance between a gate and a drain of one of the transistors of the stack, the voltage on the floating node interconnecting the transistors may fall below ground (negative voltage) thereby potentially causing a drain-to-source voltage (VDS) of one of the transistors in the stack to exceed the supply voltage while the gate-to-source voltage (VGS) of the same transistor is greater than zero but below the transistor's threshold voltage (VT). Subjecting a transistor to an elevated VDS (e.g., in excess of the circuit's VDD supply voltage) while also operating the transistor in the sub-threshold region can cause non-conductive stress on the transistor possibly leading to degradation in the performance of the transistor over time and even the transistor's failure.

The described examples address this problem. The examples herein pertain to a transistor stack (two or more serially-connected transistors). Many types of circuits use transistor stacks. Examples of such circuits include NAND gates, NOR gates, and flip-flops. The described examples are directed to NAND gates for illustrative purposes, but the scope of this disclosure is not limited to NAND gates.

Figure 1:
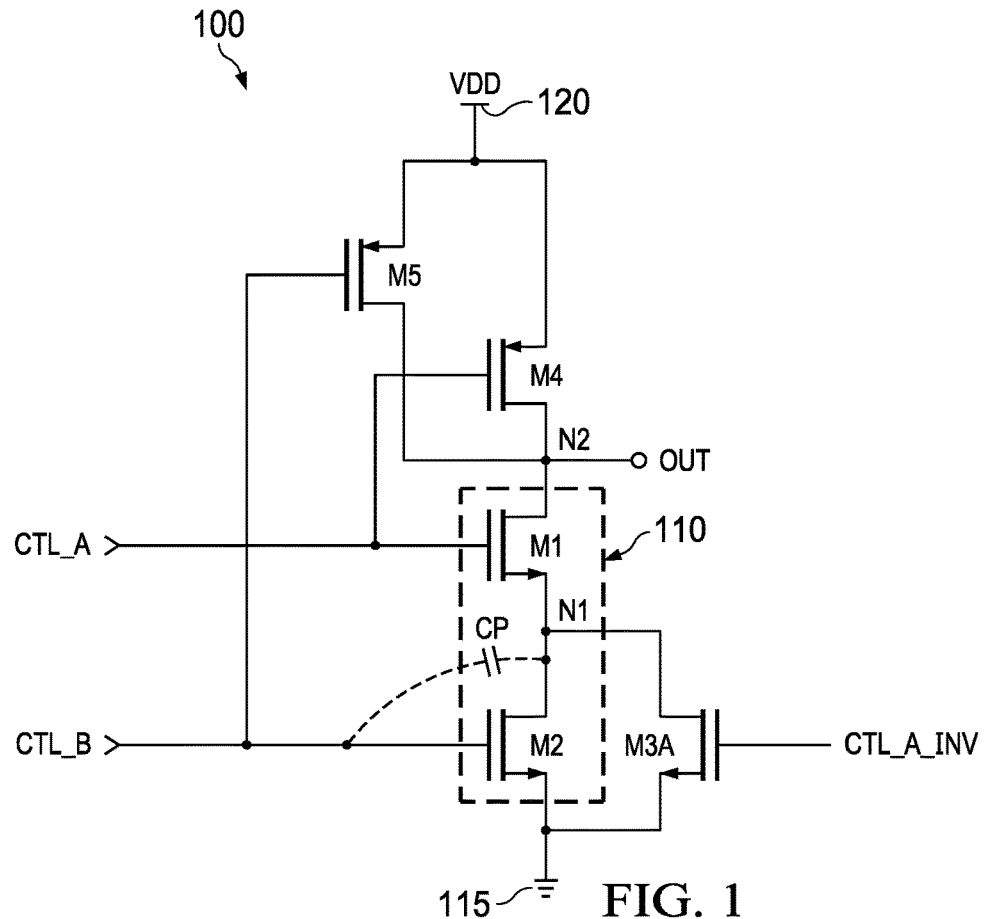
FIG. 1 illustrates an example of a circuit including a transistor stack and a component to provide a direct current (DC) bias to an intermediate node of the transistor stack.

FIG. 1 shows an embodiment of a NAND gate 100 including transistors M1, M2, M3A, M4, and M5. Each transistor M1, M2, M3A, M4, and M5 includes a control input and a pair of current terminals. In the example of FIG. 1, transistors M1 and M2 are n-channel metal oxide semiconductor field effect transistors (NMOS devices) and transistors M3A, M4, and M5 are p-channel metal oxide semiconductor field effect transistors (PMOS devices). As such, the control inputs are the gates of the respective transistors and the current terminals are the drains and sources of the respective transistors. In other implementations, any of the transistors shown in FIG. 1 can be of the opposite doping type from that shown. For example, M1 can be implemented as PMOS device. Further, any or all of the transistors shown in FIG. 1 can be implemented as bipolar junction transistors or other transistor types. As bipolar junction transistors, the control inputs are the bases of the transistors and the current terminals are the emitters and collectors.

M1 and M2 form a transistor stack 110. The source of M1 is connected to the drain of M2 thereby defining an intermediate node N1. The source of M2 is connected to a ground node 115. The drain of M1 is connected to the drains of M4 and M5 at node N2 and the sources of M4 and M5 are connected to a supply voltage node 120 (VDD).

The gates of M1 and M4 are connected together and receive a control signal CTL_A. The gates of M2 and M5 are connected together and receive a control signal CTL_B. The output (OUT) from circuit 100 is the node N2 interconnecting the drains of M1, M4, and M5 as shown. As a NAND gate, the inputs are the control signals CTL_A and CTLB and the output is OUT. When both CTL_A and CTL_B are logic high ("1"), both NMOS devices M1 and M2 are on and both the PMOS device M4 and M5 are off. With both M1 and M2 being on, OUT is pulled low to ground and thus is logic low ("0"). When either or both of CTL_A or CTL_B are low, their respective NMOS device M1 or M2 is turned off thereby disconnecting OUT from the ground potential of the ground node 115. Further, when either or both of CTL_A or CTL_B are low, their respective PMOS device M4 or M5 is turned on thereby pulling OUT up to the VDD potential of the power supply node 120. As such, OUT is only low when both CTL_A and CTL_B are low; otherwise OUT is high.

Figure 2:
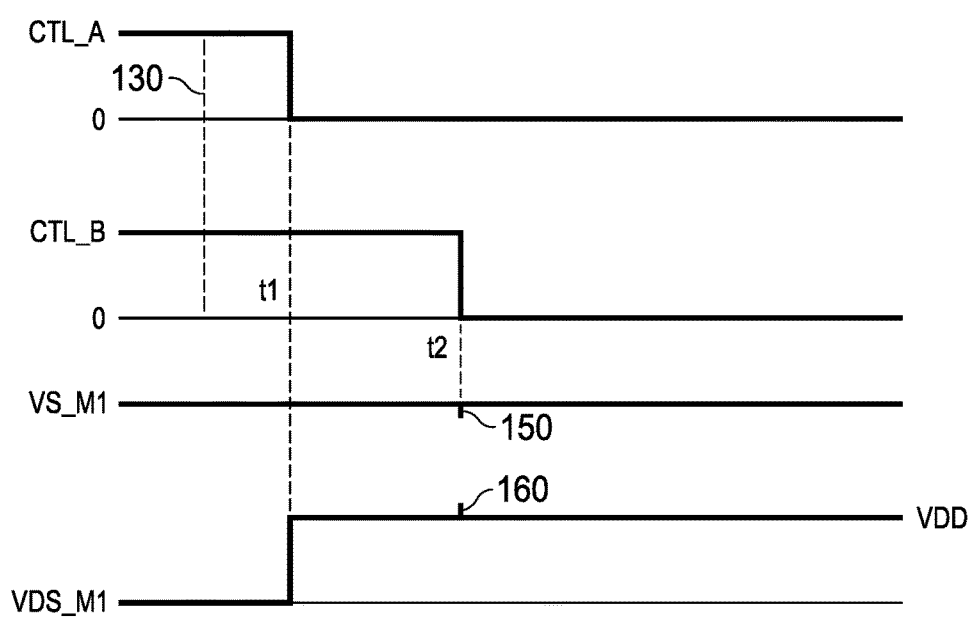
FIG. 2 illustrates waveforms pertaining to the circuit of FIG. 1.

An example of timing diagrams for the operation of NAND gate 100 are shown in FIG. 2 for CTL_A, CTL_B, the source voltage of M1 (VS_M1), and the VDS of M1

(VDS_M1). At 130, both CTL_A and CTL_B are high, which causes both of M1 and M2 to be on. At time t1, CTL_A transitions from high to low, while CTL_B remains high. VS_M1 is low due to M2 to being on and connected to ground. Further, VDS_M1 is low because M1 is on.

At time t2, CTL_B transitions from high to low. Ignoring M3A for the time being, upon CTL_B transitioning from high to low, M2 turns off. As M2 turns off (and assuming M3A is not present in the circuit), intermediate node N1 floats. With N1 floating, parasitic capacitance between the gate and drain of M2 (as shown by parasitic capacitance CP in FIG. 1) causes the voltage on N1 to fall below the ground potential and, if that were to happen, the voltage on the source of M1 decreases below ground and VDS_M1 increases to a voltage above VDD. In this state, M1 is operating in the subthreshold region as its VGS is greater than 0 but less than its VT while its VDS is above VDD thereby causing impairment of the long-term reliability of the circuit.

The inclusion of M3A, however, solves this problem. The drain of M3A is connected to the intermediate node N1 and the source of M3A is connected to the ground node 115. When M3A is on, intermediate node N1 is biased to ground. The gate of M3A is controlled by a control signal labeled as CTL_A_INV. CTL_A_INV is of the opposite polarity as CTL_A. In one example, an inverter can be included to invert CTL_A to produce CTLA_INV. When M1 is off due to CTL_A being low, M3A is on due to CTL_A_INV being high. M3A being on thereby imposes a direct current (DC) bias voltage on N1 (ground in this example). By DC biasing the intermediate node N1 at the ground potential, the reduction in voltage on N1 (VS_M1) due to M2 turning off and the parasitic gate-to-drain capacitance of M2 is significantly less than would be the case absent M3A.

As FIG. 2 show, VS_M1 is at 0V while CTL_B is high (which forces M2 to be on). When CTL_A transitions from high to low at t1, CTL_A_INV transitions from low to high thereby turning on M3A and DC biasing N1 to ground starting at t1. Node N1 remains biased to ground even after CTL_B transitions low at t2 turning M2 off due to the continued operation of M3A in the on state. A small downward momentary drop in VS_M1 may be present as indicated at 150. A small and short duration increase in VDS_M1 is also present as shown at 160 due to decrease in VS_M1 at 150, but the upward blip of VSS_M1 is much smaller in both magnitude and duration than would have been the case had M3A not been present.

The example of FIG. 1 shows a transistor stack comprising two transistors M1 and M2. The described principles for FIG. 1 and the other figures/examples apply as well to transistor stacks comprising more than two transistors.

Figure 3:
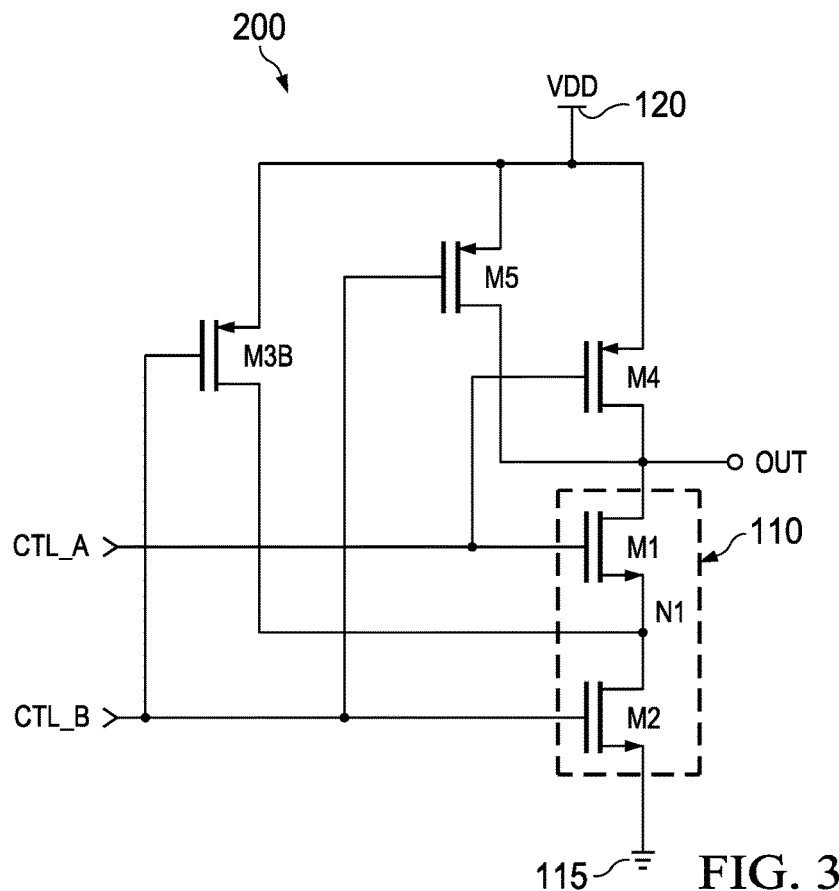
FIG. 3 shows another example of a circuit including a transistor stack and a component to DC bias to an intermediate node of the transistor stack.

FIG. 3 shows an example of a NAND gate 200 including some of the same components (e.g., M1, M2, M4, and M5) as in the example of FIG. 1. The NAND gate 200 of FIG. 3 includes a transistor M3B to impose a DC bias on intermediate node N1. In this example, M3B is a PMOS transistor whose source is connected to the supply voltage node 120 and whose drain is connected to intermediate node N1. The gate of M3B is connected to the gate of M2 and thus is controlled by the same control signal (CTL_B) as M2. An inverter is not needed to generate the control signal for M3B. As M2 is an NMOS transistor and M3B is a PMOS transistor, M2 will be on and M3B off when CTL_B is high, and M2 will be off and M3B on when CTL_B is low. Because M3B is connected to VDD, when M2 is caused to transition from on to off, M3B is turned on thereby providing a DC bias on node N1 approximately equal to VDD. This DC bias prevents the voltage on node N1 (VS_M1) from becoming negative.

Figure 4:
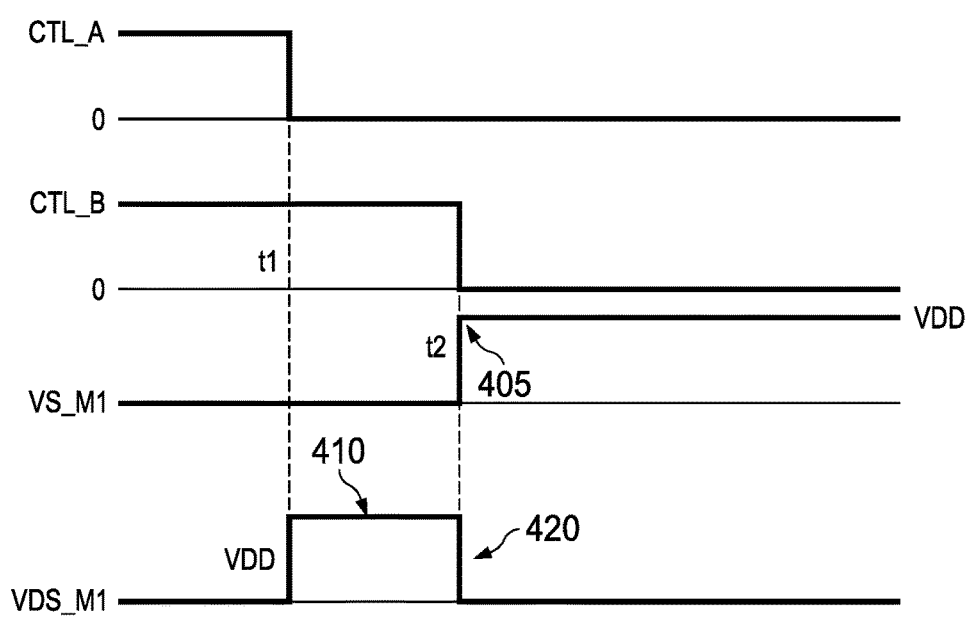
FIG. 4 illustrates waveforms pertaining to the circuit of FIG. 3.

FIG. 4 shows an example of waveforms pertaining to FIG. 3. As in FIG. 2, CTL_A is forced low at time t1 and CTL_B is forced low at time t2. Prior to t1, with both M1 and M2 on, VS_M1 is pulled low to ground. Between t1 and t2, VS_M1 remains low because M2 is still on. When M2 is turned off at t2, M3B is turned on thereby forcing MS_M1 to become high as shown at t2 (405). VDS_M1 is low prior to t1 because M1 is on prior to t1. Once M1 turns off at t1, M4 turns on thereby causing the drain of M1 to become high. With M2 still on between t1 and t2, the source of M1 (voltage on node N1) is low and thus VDS_M1 is high between t1 and t2 as shown at 410. Once M2 also turns off at t2, the source of M1 becomes high due to M3B being on. M4 continues to be on due to CTL_A being low and the voltage on the drain of M1 remains high. Thus, VDS_M1 drops to zero again at edge 420. The VDS_M1 voltage does not increase above VDD thereby avoiding or at least reducing the problem noted above.

Figure 5:
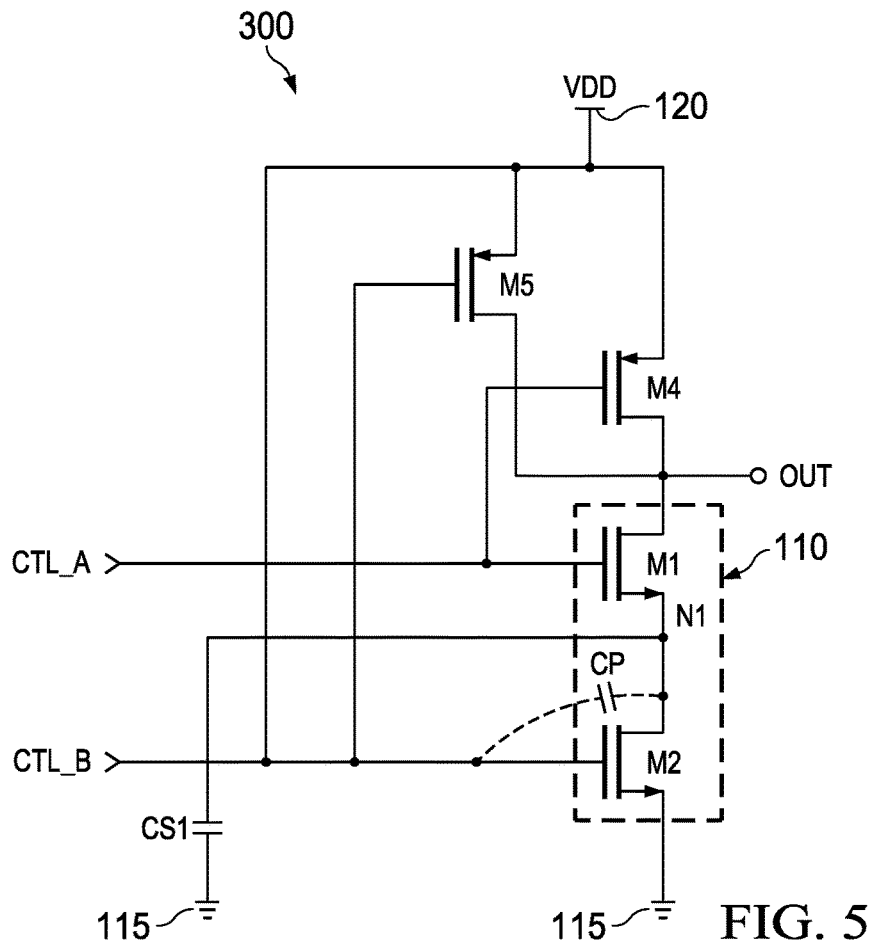
FIG. 5 shows another example of a circuit including a transistor stack and a capacitor connected to an intermediate node of the transistor stack.
Figure 6:
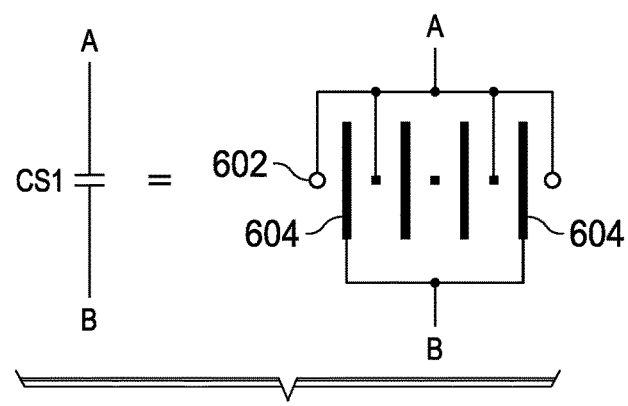
FIG. 6 shows an example implementation of the capacitor.

FIG. 5 shows an example of a NAND gate 300 including some of the same components (e.g., M1, M2, M4, and M5) as in the example of FIG. 1. The NAND gate 300 of FIG. 5 includes a capacitor CS1 connected between intermediate node N1 and ground. CS1 can be implemented as a device capacitor, a MOS transistor whose drain and source are connected together so that the gate is one terminal of the capacitor and the drain/source connection is the other terminal of the capacitor, or any other type of capacitive device. In one example, extra "dummy" transistors may be available on a semiconductor die that can be configured to be capacitor CS1. FIG. 6 shows an example of an implementation of the capacitor (CS1) by utilizing the dummy structures around actual transistor (M2). Gates 604 of the dummy structures connect to ground 115 (FIG. 5.) and the drain and source connect to node N1 (FIG. 5) shared with M2.

Figure 7:
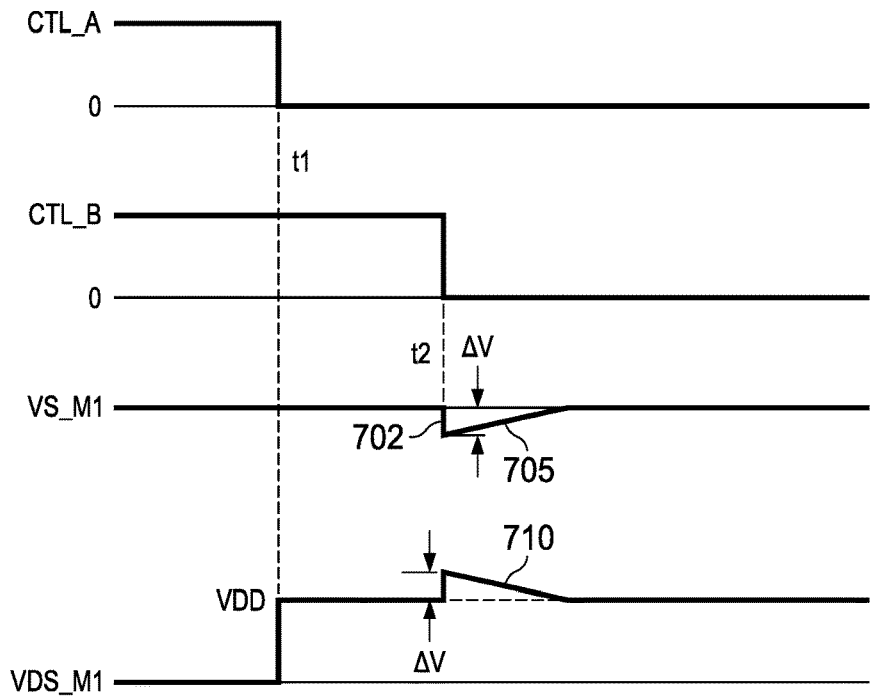
FIG. 7 illustrates waveforms pertaining to the circuit of FIG. 5.

Capacitor CS1 limits the charge coupling from the gate of M2 to the intermediate node N1. The size of capacitor CS1 is application-specific. FIG. 7 shows an example of waveforms pertaining to FIG. 5. As in FIG. 2, CTL_A is forced low at time t1 and CTL_B is forced low at time t2. Prior to t1, with both M1 and M2 on, VS_M1 is pulled low to ground. Between t1 and t2, VS_M1 remains low because M2 is still on. When M2 is turned off at t2, the voltage on node N1 (VS_M1) drops slightly (ΔV) due to the parasitic capacitance CP as shown at 702. However, the drop in VS_M1 voltage is not as large as would be the case without CS1. Negative charge on N1 dissipates through device leakage and VS_M1 then begins to increase as shown at 705. VDS_M1 is zero volts while M1 is on; once M1 turns off and M4 turns on, VDS_M1 increases to VDD as shown at time t1. VDS_M1 remains at VDD until t2 at which time M2 turns off and VS_M1 drops below zero at 702 and charges back up to zero volts at 705 as negative charge dissipates through device leakage. The drain of M1 remains fixed at VDD, but the source of M1 drops and then rises. The drop and then rise of VS_M1 is thus reflected in VDS_M1 as shown at 710. The increase in VDS_M1 above VDD also is ΔV and is less than would be the case absent CS1.

Figure 8:
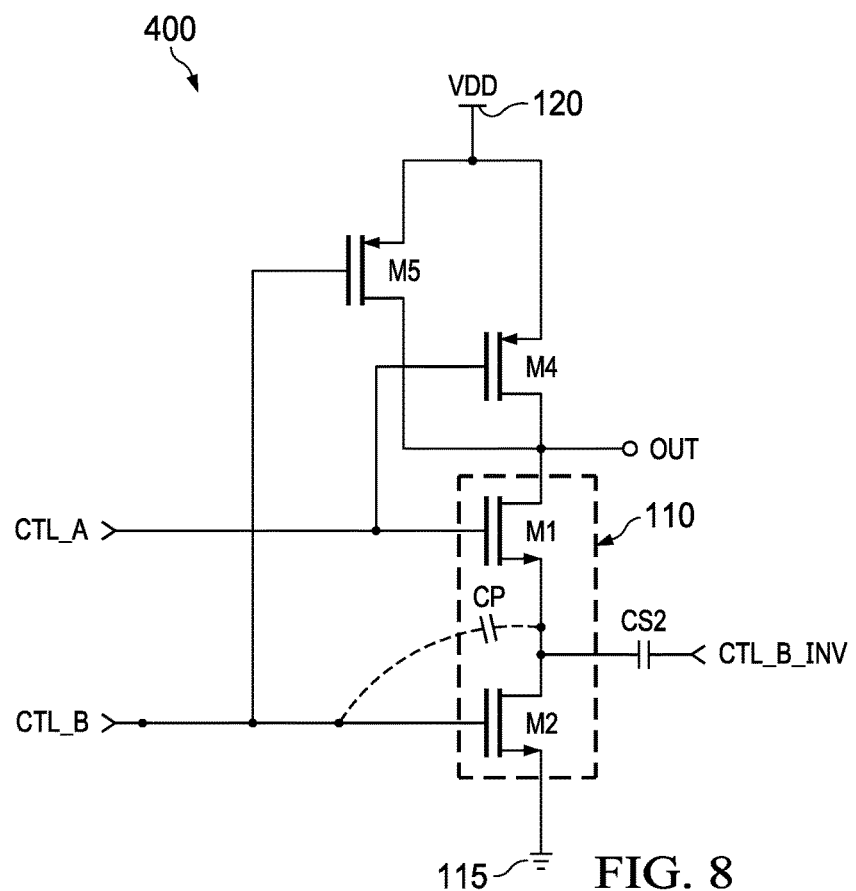
FIG. 8 shows another example of a circuit including a transistor stack and a capacitor connected to an intermediate node of the transistor stack.

FIG. 8 shows an example of a NAND gate 400 including some of the same components (e.g., M1, M2, M4, and M5) as in the example of FIG. 1. The NAND gate 400 of FIG. 8 includes a capacitor CS2 with one terminal being connected to intermediate node N1 and the other terminal receiving a control voltage CTL_B_INV (opposite polarity of CTL_B, generated, for example, by an inverter). CS2 can be implemented as described above regarding CS1. Through capacitor CS2, opposite charge is provided to node N1 from that caused by the parasitic capacitor CP. That is, to a certain degree, capacitor CS2 provides charge balancing on node N1 thereby reducing the large downward drop in voltage on N1 that would otherwise be the case in the absence of CS2. The coupling efficiency is given by Cp/Ctotal, where Ctotal is the total capacitance of the intermediate node N1. In the case of CS1 connected to ground, the coupling efficiency is decreased per Cp/(Cotal+CS1). In the case of CS2 since the opposite terminal of CS2 is also switching between VDD and GND the coupling efficiency is reduced per Cp(Cotal+2*CS2). Thus, the ratio of voltages from without either CS1 or CS2 as compared to inclusion of CS1 or CS2 is, in the case of CS1 Ctotal/(Ctotal+CS1) and in the case of CS2 Ctotal/(Ctotal+2*CS2).

Figure 9:
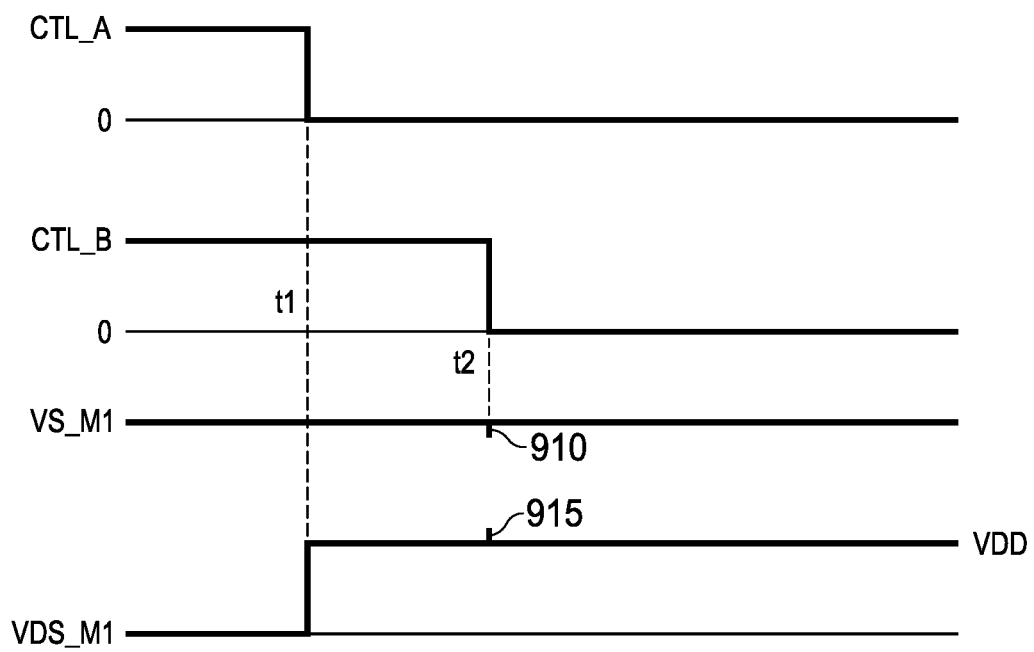
FIG. 9 illustrates waveforms pertaining to the circuit of FIG. 8.

FIG. 9 shows the waveforms pertaining to the operation of the NAND gate 400 of FIG. 8. The waveforms for CTL_A, CTL_B, VS_M1, and VDS_M1 are largely the same as in FIG. 2 and described above. A small drop in VS_M1 may be present as identified at 810 in the waveforms of FIG. 9. A corresponding small increase in VDS_M1 also may be present as shown at 915.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit comprising:
a first transistor comprising a first current terminal, a second current terminal, and a first control terminal;
a second transistor comprising a third current terminal, a fourth current terminal, and a second control terminal, wherein the third current terminal is coupled to the second current terminal, and wherein the fourth current terminal is coupled to a ground terminal;
a third transistor comprising a fifth current terminal and a sixth current terminal, wherein the fifth current terminal is coupled to a supply node, wherein the sixth current terminal is coupled to the first current terminal; and
a first capacitor comprising a first capacitor terminal and a second capacitor terminal,
wherein the third transistor includes a third control terminal coupled to the first control terminal,
wherein the first capacitor terminal is coupled to the second current terminal and to the third current terminal, and
wherein the second capacitor terminal is configured to receive a first control signal.

2. The circuit of claim 1,
wherein the second control terminal is configured to receive a second control signal, and
wherein a polarity of the first control signal is opposite a polarity of the second control signal.

3. The circuit of claim 1, further comprising a fourth transistor coupled to the first current terminal,
wherein the fourth transistor includes a fourth control terminal coupled to the second control terminal.

4. The circuit of claim 3, wherein the first current terminal is configured to provide an output signal that is a logical NAND of signals provided to the first and second control terminals.

5. The circuit of claim 3,
wherein the second control terminal is configured to receive a second control signal, and
wherein a polarity of the first control signal is opposite a polarity of the second control signal.

6. The circuit of claim 1, further comprising a fourth transistor including a fourth control terminal, a seventh current terminal, and an eighth current terminal,
wherein the third control terminal is coupled to the first control terminal,
wherein the eighth current terminal is coupled to the first current terminal, and
wherein the fourth control terminal is coupled to the second control terminal.

7. The circuit of claim 6, wherein the fifth current terminal is coupled to the seventh current terminal.

8. The circuit of claim 1, further comprising a parasitic capacitance charge between the third current terminal and the second control terminal.

9. The circuit of claim 8, wherein the first capacitor is configured to provide an opposite charge of the parasitic capacitance charge to the third current terminal.

10. A circuit comprising:
a first transistor comprising a first current terminal, a second current terminal, and a first control terminal;
a second transistor comprising a third current terminal, a fourth current terminal, and a second control terminal, wherein the third current terminal is coupled to the second current terminal, and wherein the fourth current terminal is coupled to a ground terminal;
a first capacitor comprising a first capacitor terminal and a second capacitor terminal; and
a parasitic capacitance charge between the third current terminal and the second control terminal,
wherein the first capacitor terminal is coupled to the second current terminal and to the third current terminal, and
wherein the second capacitor terminal is configured to receive a first control signal.

11. The circuit of claim 10, wherein the first capacitor is configured to provide an opposite charge of the parasitic capacitance charge to the third current terminal.

12. The circuit of claim 10,
wherein the second control terminal is configured to receive a second control signal, and
wherein a polarity of the first control signal is opposite a polarity of the second control signal.

13. The circuit of claim 10, further comprising:
third transistor coupled to the first current terminal; and
fourth transistor coupled to the first current terminal,
wherein the third transistor includes a third control terminal coupled to the first control terminal, and
wherein the fourth transistor includes a fourth control terminal coupled to the second control terminal.

14. The circuit of claim 13, wherein the first current terminal is configured to provide an output signal that is a logical NAND of signals provided to the first and second control terminals.

15. The circuit of claim 10, further comprising:
a third transistor including a third control terminal, a fifth current terminal, and a sixth current terminal; and a fourth transistor including a fourth control terminal, a seventh current terminal, and an eighth current terminal, wherein the fifth current terminal is coupled to the seventh current terminal, wherein the sixth current terminal is coupled to the first current terminal, wherein the third control terminal is coupled to the first control terminal, wherein the eighth current terminal is coupled to the first current terminal, and wherein the fourth control terminal is coupled to the second control terminal.

16. The circuit of claim 15, wherein the fifth current terminal is coupled to a supply node.

17. A circuit comprising:
a first transistor comprising a first current terminal, a second current terminal, and a first control terminal;
a second transistor comprising a third current terminal, a fourth current terminal, and a second control terminal, wherein the third current terminal is coupled to the second current terminal, and wherein the fourth current terminal is coupled to a ground terminal;
a third transistor coupled to the first current terminal; and
a first capacitor comprising a first capacitor terminal and a second capacitor terminal, wherein the third transistor includes a third control terminal coupled to the second control terminal, wherein the first capacitor terminal is coupled to the second current terminal and to the third current terminal, and wherein the second capacitor terminal is configured to receive a first control signal.

18. The circuit of claim 17,
wherein the second control terminal is configured to receive a second control signal, and
wherein a polarity of the first control signal is opposite a polarity of the second control signal.

19. The circuit of claim 17, wherein the third transistor comprises:
a fifth current terminal coupled to a supply node; and
a sixth current terminal coupled to the first current terminal.

20. The circuit of claim 19, further comprising a fourth transistor including:
a fourth control terminal coupled to the second control terminal; and
an eighth current terminal coupled to the first current terminal.

* * * * *